United States Patent
Sato

(10) Patent No.: US 7,883,600 B2
(45) Date of Patent: Feb. 8, 2011

(54) RF SUPPLY SYSTEM AND PLASMA PROCESSING APPARATUS

(75) Inventor: Kenji Sato, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1132 days.

(21) Appl. No.: 11/262,747

(22) Filed: Nov. 1, 2005

(65) Prior Publication Data
US 2006/0090854 A1      May 4, 2006

(30) Foreign Application Priority Data
Nov. 2, 2004   (JP)   ............................. 2004-319634

(51) Int. Cl.
H01L 21/00   (2006.01)
C23C 16/00   (2006.01)
C23C 14/00   (2006.01)
(52) U.S. Cl. ........................... 156/345.28; 156/345.43; 156/345.44; 156/345.47; 118/723 R; 118/723 E
(58) Field of Classification Search ................. 118/728, 118/723 R, 723 E; 156/345.51, 345.28, 345.43, 156/345.47, 345.44
See application file for complete search history.

(56) References Cited

U.S. PATENT DOCUMENTS

| 6,331,754 | B1 | 12/2001 | Satoyoshi et al. |
| 6,427,621 | B1 | 8/2002 | Ikegawa et al. |
| 2002/0025686 | A1 | 2/2002 | Ohmoto et al. |
| 2003/0098127 | A1* | 5/2003 | Nakano et al. ......... 156/345.44 |
| 2004/0035365 | A1* | 2/2004 | Yamazawa et al. ....... 118/723 E |
| 2005/0031796 | A1* | 2/2005 | Wu et al. .................... 427/569 |

FOREIGN PATENT DOCUMENTS

| TW | 473775 | 1/2002 |
| TW | 478026 | 3/2002 |
| TW | 516113 | 1/2003 |

* cited by examiner

Primary Examiner—Ram N. Kackar
(74) Attorney, Agent, or Firm—Oblon, Spivak, McClelland, Maier & Neustadt, L.L.P.

(57) ABSTRACT

An RF supply system is to be connected to an RF electrode disposed outside or inside a process chamber to assist a plasma process performed in the process chamber. This system includes an RF power supply, a matching unit, and an impedance converter. The RF power supply is configured to supply an RF power for plasma generation to the electrode through a transmission path. The matching unit is disposed on the transmission path between the RF power supply and the electrode, and configured to match a load impedance viewing from the RF power supply with an impedance of the RF power supply side. The impedance converter is disposed on the transmission path between the matching unit and the electrode, and configured to convert a load impedance viewing from the matching unit to an impedance higher than an actual impedance on the electrode side.

18 Claims, 5 Drawing Sheets

RF SUPPLY SYSTEM AND PLASMA PROCESSING APPARATUS

CROSS-REFERENCE TO RELATED APPLICATIONS

This application is based upon and claims the benefit of priority from prior Japanese Patent Application No. 2004-319634, filed Nov. 2, 2004, the entire contents of which are incorporated herein by reference.

BACKGROUND OF THE INVENTION

1. Field of the Invention

The present invention relates to an RF (Radio Frequency) supply system for supplying an RF power for plasma generation, and a plasma processing apparatus using the system. For example, the plasma processing apparatus is used for performing a plasma process on a target substrate in a semiconductor processing system. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

2. Description of the Related Art

In manufacturing processes for semiconductor devices or FPDs (Flat Panel Display), plasma processing apparatuses are often used for performing processes by plasma, such as etching, deposition, oxidation, and sputtering. In general, a plasma processing apparatus includes an RF electrode disposed outside or inside a process container or process chamber, and an RF supply section configured to supply an RF power to the RF electrode. Typically, the RF supply section includes not only an RF power supply for outputting the RF power, but also a matching unit for matching the impedance of the RF power supply side with the impedance of the load side (the electrode, plasma, and process chamber).

FIG. 4 is a view showing a plasma processing apparatus including a conventional RF supply section. Specifically, an upper electrode 102 and a lower electrode 104 are disposed in parallel with each other inside a process chamber 100 configured to reduce a pressure therein. A lower electrode 104 used as a worktable is disposed to place thereon a target substrate, such as semiconductor wafer W. According to this arrangement, the lower electrode 104 serves as an RF electrode, to which an RF power is supplied from the RF supply section 106. The upper electrode 102 serves as a counter electrode, which is connected to the ground potential through the process chamber 100. The space inside the process chamber 100, particularly the space between the upper electrode 102 and lower electrode 104, is supplied with a predetermined process gas from a process gas supply source (not shown). An exhaust port 108 is formed at the bottom of the process chamber 100, and is connected to an exhaust unit 112 through an exhaust line 110. A substrate transfer port (not shown) is formed in the sidewall of the process chamber 100, and is configured to be opened and closed when a substrate W is transferred in and out.

The RF supply section 106 includes an RF power supply 114, a matching unit 116, and a feed rod 118. The RF power supply 114 is configured to output an RF power with a predetermined frequency of, e.g., 13.56 MHz at a predetermined power level. For example, the matching unit 116 includes an L-type circuit consisting of two variable capacitors 120 and 122 and one coil 124. The matching unit 116 further includes a voltage/current sensor 126 (FIG. 5), a controller, and an actuator (not shown) to adjust and control the capacitances of the capacitors 120 and 122. In other words, the matching unit 116 is structured as a so-called matching box. The feed rod 118 is formed of a coaxial tube with one end connected to the output terminal of the matching unit 116, and the other end connected to the bottom of the lower electrode 104. The feed rod is used for the transmission path to reduce the transmission impedance to be as small as possible.

As described later, however, the present inventor has found some problems in the structure shown in FIG. 4. One of the problems concerns transmission loss and heat generation in supplying an RF power. Another problem concerns flexibility in the size and location of the matching unit. A further problem concerns flexibility in the design of the RF generation mechanism on the process chamber side, in accordance with increase in the diameter of the process chamber.

BRIEF SUMMARY OF THE INVENTION

An object of the present invention is to provide an RF supply system and plasma processing apparatus, which can reduce transmission loss and heat generation, so as to remarkably improve the RF supply efficiency.

Another object of the present invention is to provide an RF supply system and plasma processing apparatus, which can reduce the volume and size of a matching unit typically formed as a matching box, and increase the flexibility of location of the matching unit.

Another object of the present invention is to provide an RF supply system and plasma processing apparatus, which allow an RF generation mechanism on a process chamber side to be designed and constructed with an arbitrary impedance.

According to a first aspect of the present invention, there is provided an RF supply system to be connected to an RF electrode disposed outside or inside a process chamber to assist a plasma process performed in the process chamber, the system comprising:

an RF power supply configured to supply an RF power for plasma generation to the electrode through a transmission path;

a matching unit disposed on the transmission path between the RF power supply and the electrode, the matching unit being configured to match a load impedance viewing from the RF power supply with an impedance of the RF power supply side; and an impedance converter disposed on the transmission path between the matching unit and the electrode, the impedance converter being configured to convert a load impedance viewing from the matching unit to an impedance higher than an actual impedance on the electrode side.

According to a second aspect of the present invention, there is provided a plasma processing apparatus comprising:

a process chamber configured to provide a pressure-reduced space for performing a plasma process on a target substrate;

an RF electrode disposed outside or inside the process chamber to assist the plasma process;

a process gas supply system configured to supply a process gas into the process chamber;

an RF power supply configured to supply an RF power for plasma generation to the electrode through a transmission path;

a matching unit disposed on the transmission path between the RF power supply and the electrode, the matching unit being configured to match a load impedance viewing from the RF power supply with an impedance of the RF power supply side; and an impedance converter disposed on the transmission path between the matching unit and the electrode, the impedance converter being configured to convert a load impedance viewing from the matching unit to an impedance higher than an actual impedance on the electrode side.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 4:
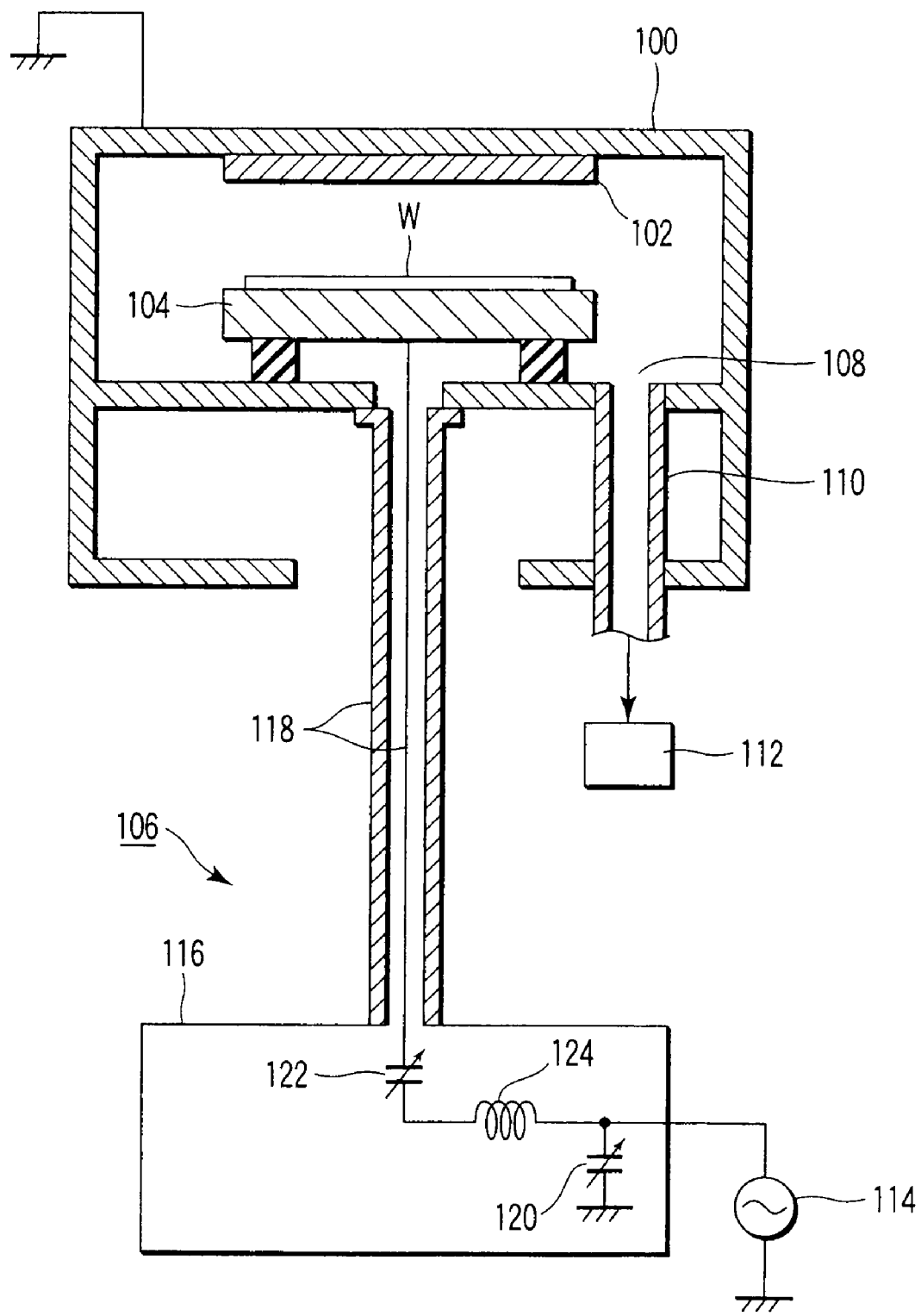
FIG. 4 is a view showing a plasma processing apparatus having a conventional RF supply section.

In the process of developing the present invention, the inventors studied conventional plasma processing apparatuses and RF supply sections thereof, such as those shown in FIG. 4. As a result, the inventors have arrived at the findings given below.

Figure 5:
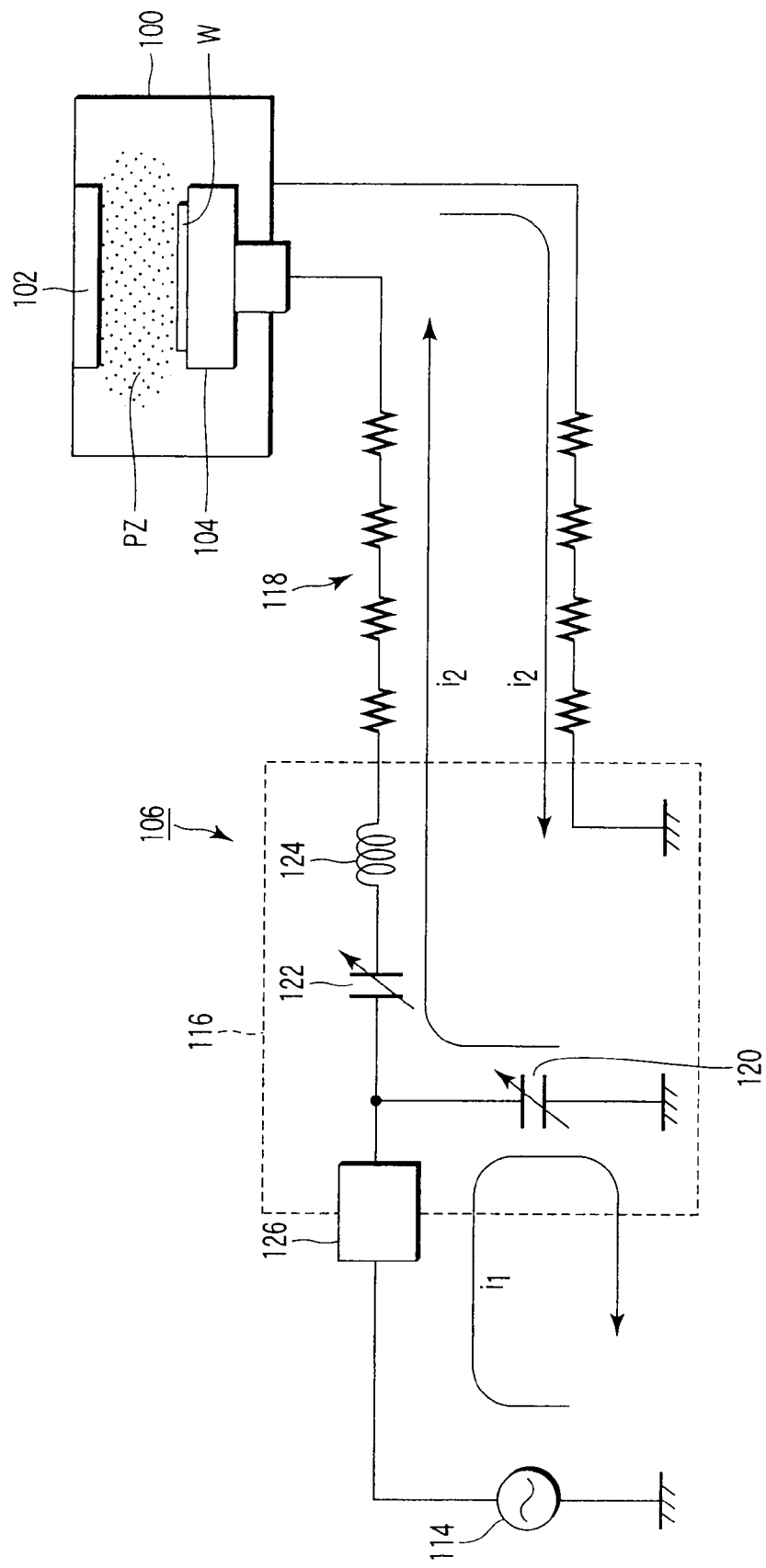
FIG. 5 is a view for explaining an operation of the RF supply section shown in FIG. 4.

FIG. 5 is a view for explaining an operation of the RF supply section shown in FIG. 4. When an RF power is supplied from the RF supply section 106 to the lower electrode 104 inside the process chamber 100, plasma PZ of a process gas is generated in the space between the upper electrode 102 and lower electrode 104. Viewing from the RF supply section 106, the lower electrode 104, plasma PZ, upper electrode 102, and process chamber 100 are connected in series and form an integrated load (which will be referred to as "process chamber load" hereinafter). An RF primary current $i_1$ flows between the RF power supply 114 and matching unit 116, and an RF secondary current $i_2$ flows between the matching unit 116 and process chamber load.

The matching unit 116 performs matching with the RF power supply 114 side at a stipulated value, such as 50 Ω. Accordingly, where P(W) denotes the output power of the RF power supply 114, the primary current $i_1$ (A) is expressed by the following formula (1).

$$i_1 = (P/50)^{1/2} \quad (1)$$

On the other hand, where $r_L(\Omega)$ denotes the impedance of the process chamber load, and $r_S(\Omega)$ denotes the transmission impedance of the secondary side (a resistance component mainly provided by the feed rod 118), the secondary current $i_2$(A) is expressed by the following formula (2).

$$i_2 = \{P/(r_L + r_S)\}^{1/2} \quad (2)$$

Common plasma processing apparatuses have a process chamber load of 5 Ω or less, and for example, large diameter process chambers for 300 mm wafers or FPDs have a process chamber load of several Ω or 1 Ω or less. Conventionally, an RF power is applied to such a process chamber load of low impedance by a large secondary current $i_2$, so the power loss is large and the power supply efficiency for plasma generation is low.

For example, in the case described above, if the impedance $r_L$ of the process chamber load is 1 Ω, the output power P of the RF power supply 114 is 5,000 W, and the transmission impedance $r_S$ of the secondary side is 0.5 Ω, the formulas (1) and (2) produce $i_1$=10 A and $i_2$=58 A. In this case, the loss caused by $r_S$ is 1,682 W ($r_S \times i_2^2$), and the power consumed by the process chamber load is 3,364 W ($r_L \times i_2^2$). That is, although the matching unit 116 is used, only about ⅔ of the power output from the RF supply section 106 is supplied into the process chamber 100, and the rest, i.e., about ⅓ of the power, is consumed by the resistance of the transmission circuit or transmission path in generating unnecessary heat as a loss.

Further, as the secondary current $i_2$ is larger, each of the variable capacitors 120 and 122 and inductance coil 124 of the matching unit 116 needs to have a larger current capacity and thus have a larger size. Along with this, an adjustable setting mechanism, such as an actuator, becomes larger thereby making the matching box bulky as a whole. Such a large matching unit 116 is hard to dispose or attach very close to the process chamber 100. As the matching unit 116 is further away from the process chamber 100, the feed rod 118 is correspondingly longer (thus increasing $r_S$), thereby further lowering the supply efficiency. In other words, the location of the matching unit 116 becomes disadvantageously more restricted.

In plasma processing apparatuses, the larger the diameter of the process chamber, the higher the power structure of the process chamber needs to be, and thus the impedance of the process chamber load increasingly becomes lower. However, the conventional RF supply system described above cannot be adapted to such an increase in the diameter of the process chamber.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

Figure 1:
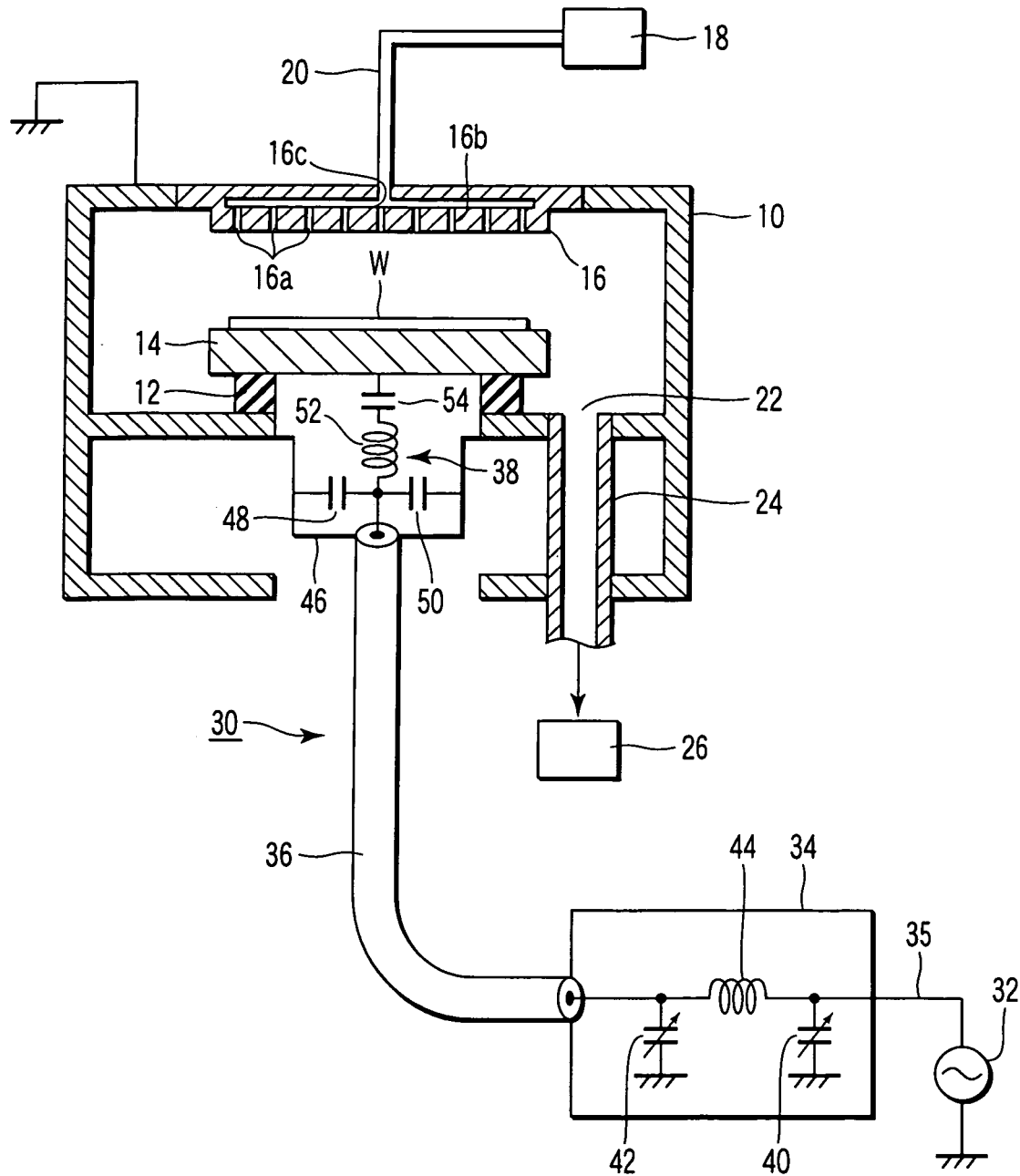
FIG. 1 is a view showing a plasma processing apparatus having an RF supply section according to an embodiment of the present invention.

FIG. 1 is a view showing a plasma processing apparatus having an RF supply section according to an embodiment of the present invention. This plasma processing apparatus is arranged as a parallel-plate plasma processing apparatus of the capacitive coupling type. This apparatus includes a cylindrical process container or process chamber 10 made of, e.g., aluminum with an alumite-processed (anodization-processed) inner surface. The process chamber 10 is protectively grounded.

A susceptor 14 made of, e.g., aluminum is disposed on the bottom of the process chamber 10 with a cylindrical insulating member 12 interposed therebetween. This susceptor 14 serves as a lower electrode as well as a member on which a target substrate, such as semiconductor wafer W, is placed. Since the susceptor 14 serves as an RF electrode, it is supplied with an RF power for plasma generation from the RF supply section 30. The configuration and operation of the RF supply section 30 will be explained later.

An upper electrode 16 is disposed above the susceptor 14 to face the susceptor in parallel therewith. This upper electrode 16 is configured as a showerhead, and thus has a gas buffer cell 16b and a number of through holes 16a for delivering a process gas toward the substrate W placed on the susceptor 14. A gas supply port 16c is formed on the showerhead 16 and is connected to a process gas supply section 18 through a gas supply line 20.

An exhaust port 22 is formed at the bottom of the process chamber 10 and is connected to an exhaust unit 26 through an exhaust line 24. The exhaust unit 26 includes a vacuum pump, such as a turbo molecular pump, to reduce the pressure of the process space inside the process chamber 10 to a desired vacuum level. Further, a substrate transfer port (not shown) for transferring the substrate W is formed in the sidewall of the process chamber 10 and provided with closing mechanism, such as a gate valve.

In this plasma processing apparatus, where the substrate W placed on the susceptor 14a is processed with plasma, the following operation is performed. Specifically, a desired process gas is supplied at a predetermined flow rate from the process gas supply section 18 into the process chamber 10, while the exhaust unit 26 is operated to adjust the pressure inside the process chamber 10 to a set value. Further, an RF power with a predetermined frequency is applied at a predetermined power from the RF supply section 30 to the susceptor (lower electrode 14). The process gas is delivered from the through holes 16a of the upper electrode (showerhead) 16, and is turned into plasma between the lower and upper electrodes 14 and 16 by glow discharge. This plasma produces radicals and ions, by which a plasma process, such as etching or deposition, is performed on the main surface (upper surface) of the substrate W.

The RF supply section 30 includes an RF power supply 32, a matching unit 34, a feed line 36, and an impedance converter 38. The RF power supply 32 is configured to output an RF power with a predetermined frequency of, e.g., 13.56 MHz at a desired power. The matching unit 34 includes a π-type circuit formed of, e.g., two variable capacitors 40 and 42 and one coil 44. The matching unit 34 also includes a voltage/current sensor 45 (FIG. 2), a controller, and an actuator (not shown) to adjust and control the capacitances of the capacitors 40 and 42. Specifically, the matching unit 34 is arranged as a so-called matching box. The feed line 36 is formed of a coaxial cable with one end connected to the output terminal of the matching unit 34, and the other end connected to the input terminal of the impedance converter 38. A feed line, such as a coaxial cable, may be also used for a signal transmission line 35 between the RF power supply 32 and matching unit 34.

The impedance converter 38 consists of capacitors 48, 50, and 54 and a coil 52 combined to form a reactance circuit. The impedance converter 38 is built in a casing 46 disposed or attached near the susceptor 14. The impedance converter 38 forms an L-type circuit as a whole. More specifically, the capacitors 48 and 50 are connected in parallel between the end of the feed line 36 and the ground potential. The coil 52 and capacitor 54 are connected in series between the end of the feed line 36 and the susceptor 14. The casing 46 is formed of a conductive plate, and connected to the ground potential through the process chamber 10. Each of the capacitors 48, 50, and 54 is a non-variable capacitor (i.e., the capacitance is not variable), and the coil 52 is a non-variable inductor (i.e., the inductance is not variable). Specifically, the impedance converter 38 includes no reactance adjusting mechanism.

The impedance converter 38 is configured to convert the load impedance, as viewed from the matching unit 34, to an impedance (transformed impedance) higher than an actual impedance on the susceptor side. The impedance converter 38 is preferably configured as a matching circuit network to perform matching with the characteristic impedance of the feed line 36.

Figure 2:
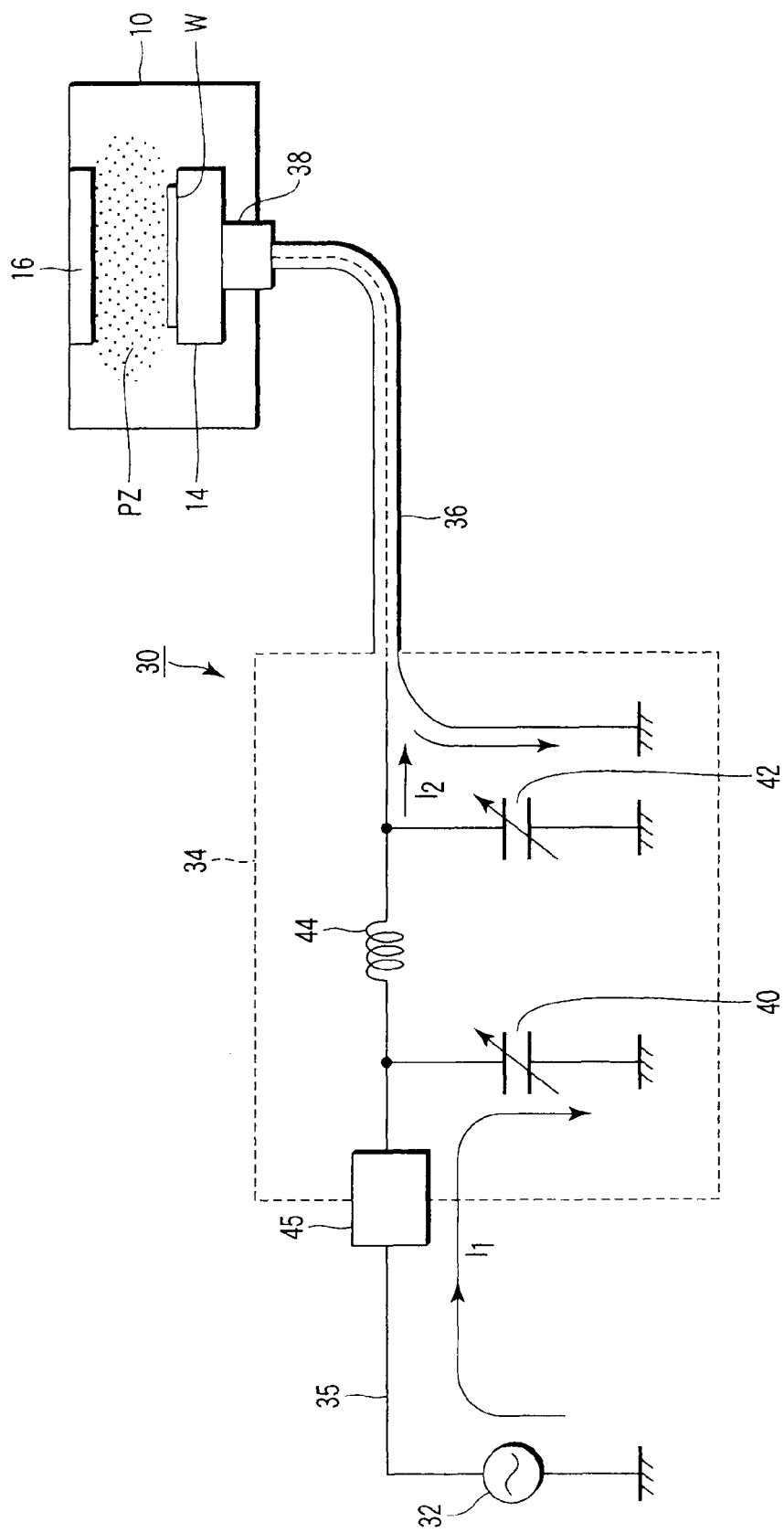
FIG. 2 is a view for explaining an operation of the RF supply section shown in FIG. 1.

FIG. 2 is a view for explaining an operation of the RF supply section shown in FIG. 1. When an RF power is supplied from the RF supply section 30 to the susceptor (lower electrode) 14 inside the process chamber 10, plasma PZ of a process gas is generated in the space between the upper electrode 16 and susceptor (lower electrode) 14. Viewing from the RF supply section 30, the susceptor 14, plasma PZ, upper electrode 16, and process chamber 10 are connected in series and form an integrated load, i.e., process chamber load. An RF primary current $I_1$ flows between the RF power supply 32 and matching unit 34, and an RF secondary current $I_2$ flows between the matching unit 34 and impedance converter 38.

The matching unit 34 performs matching with the RF power supply 32 side at a stipulated value, such as 50 Ω. Accordingly, where P(W) denotes the output power of the RF power supply 32, the primary current $I_1(A)$ is expressed by the following formula (3).

$$I_1 = (P/50)^{1/2} \quad (3)$$

On the other hand, where $R_L(\Omega)$ denotes the transformed impedance of the impedance converter 38, and $R_S(\Omega)$ denotes the transmission impedance of the secondary side (a resistance component mainly provided by the feed line 36), the secondary current $I_2(A)$ is expressed by the following formula (4).

$$I_2 = \{P/(R_L + R_S)\}^{1/2} \quad (4)$$

As described above, where the impedance converter 38 is configured as a matching circuit network, the transformed impedance $R_L$ is the stipulated value, i.e., 50 Ω, and thus the formula (4) is changed to the following formula (5).

$$I_2 = \{P/(50 + R_S)\}^{1/2} \quad (5)$$

For example, if the output power P of the RF power supply 32 is 5,000 W, and the secondary side transmission impedance $R_S$ is 0.5 Ω, the formulas (3) and (5) produce $I_1 = 10$ A and $I_2 = 9.95$ A. The loss caused by the secondary side transmission impedance $R_S$ is 49.5 W ($R_S \times I_2^2$), and the power supplied to the impedance converter 38 is 4,950 W ($R_L \times I_2^2$). The impedance converter 38 is formed of a reactance circuit, and is disposed adjacent to the susceptor 14. Accordingly, the loss caused by the interior of the impedance converter 38 and the transmission line up to the susceptor 14 is so small as to be negligible. In this case, most of the power (4,950 W) input into the impedance converter 38 is supplied into the process chamber load as it is. Specifically, about 90% of the RF power output from the RF supply section 32 is used for plasma generation within the process chamber 10. The transmission loss is only about 10%.

As described above, the low impedance of the process chamber load is transformed to a high impedance by the impedance converter 38, so that the RF power from the RF power supply 32 is supplied to the process chamber load with a high transmission efficiency. This arrangement improves flexibility in the design of respective portions (such as the process chamber 10, susceptor 14, and upper electrode 16), in accordance with a decrease in the impedance of the process chamber load, i.e., increase in the diameter and power of the process chamber. Accordingly, the present invention can be easily adapted to an increased diameter of the process chamber.

In the matching unit 34, the secondary current $I_2$ is at almost the same level as the primary current $I_1$, and thus the reactance circuit (40, 42, 44, etc.) can have a smaller current capacity. This brings about a decrease in the necessary power for the reactance adjusting mechanism, thereby making the matching box compact. Further, since the current capacity is small, the loss and heat generation in the matching unit 34 are also reduced.

Furthermore, since the secondary current $I_2$ is small and thus the transmission loss caused by the feed line 36 is small, the feed line 36 can be extended to dispose the matching unit 34 at an arbitrary position. On the other hand, since the impedance converter 38 is formed of a non-variable reactance circuit without any reactance adjusting mechanism, it can be compact and thus easily disposed or attached very close to the susceptor 14.

In place of the L-type circuit shown in the drawings, a T-type circuit or π-type circuit may be used to configure the impedance converter 38 as a two-port reactive converter or reactive inverter. In this case, the reactance of the reactance circuit (40, 42, 44, etc.) can be selected to satisfy desired transformation conditions or matching conditions.

Figure 3:
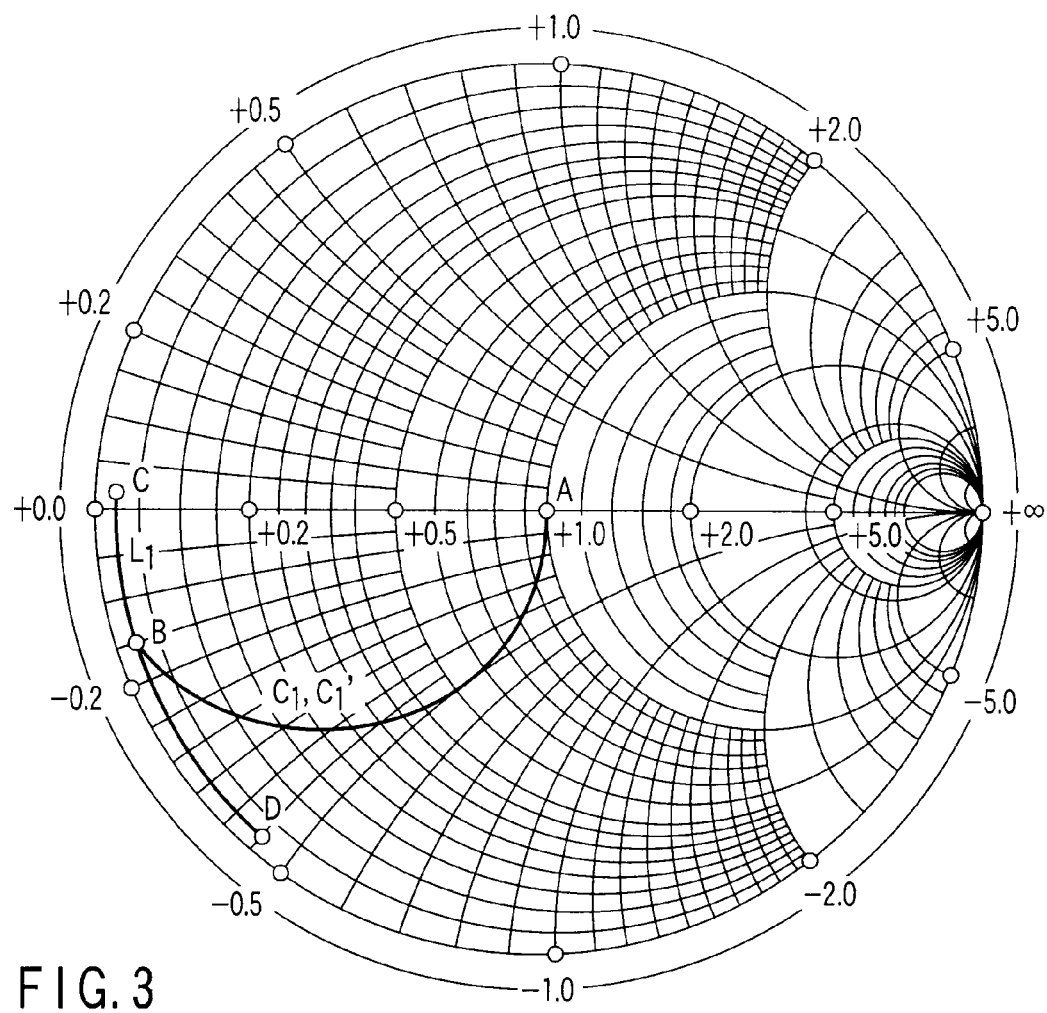
FIG. 3 is a Smith Chart used in an embodiment of the present invention.

FIG. 3 is a Smith Chart used in an embodiment of the present invention in selection of the reactance. In FIG. 3, a point A corresponds to the input end of the impedance converter 38, i.e., the end of the feed line 36. Since the chart is normalized by a characteristic impedance (50 Ω), the impedance is "+1" at the point A on the chart. This impedance of 50 Ω at the input end is converted to a lower impedance by the capacitors 48 and 50 disposed in parallel at the input stage. On the chart, the impedance shifts from the point A to a point B. The point B can be moved on a curved line C1-C1' in accordance with the capacitances of the capacitors 48 and 50. Then, the imaginary part is cancelled by the coil 52 disposed in series, and thus the impedance shifts from the point B to a point C. The point C can be moved on a curved line L1 in accordance with the inductance of the coil 52. The capacitor 54 on the last stage is disposed to cancel the imaginary part of the load (to produce resonance), by which the impedance shifts from the point C to a point D on the chart. The point D can be moved on a curved line C2 in accordance with the capacitance of the capacitor 54.

The present invention has been described with reference to one embodiment, but the present invention may be modified in various manners within a scope of the technical idea thereof. For example, the impedance converter 38 may include a reactance-variable element, such as a variable capacitor. A part of the entirety of the impedance converter 38 may be formed or disposed integratedly with the susceptor 14. The feed line 36 may be replaced with an arbitrary signal transmission line, such as a feed rod. The circuit configuration and adjusting mechanism of the matching unit 34 may be replaced with arbitrary ones.

Figure 6:
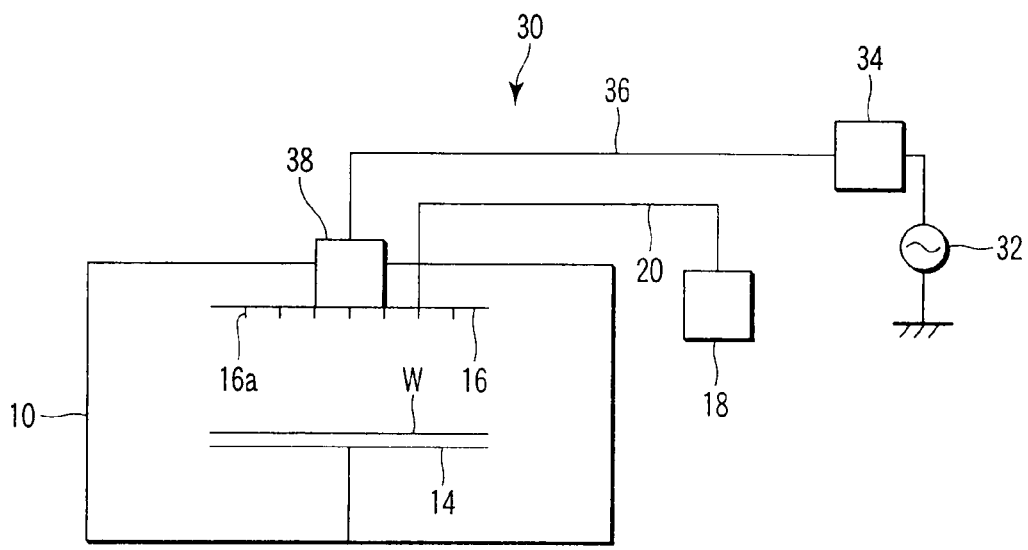
FIG. 6 is a view showing a plasma processing apparatus having an RF supply section according to another embodiment of the present invention.

The embodiment described above is exemplified by a parallel-plate plasma processing apparatus of the capacitive coupling type in which only the susceptor (lower electrode) 14 is supplied with an RF power. Alternatively, the present invention may be applied to an apparatus of the type in which only an upper electrode 16 is supplied with an RF power. FIG. 6 is a view showing a plasma processing apparatus having an RF supply section according to another embodiment of the present invention, arranged in light of such an aspect. In FIG. 6, the members corresponding to those in FIG. 1 are denoted by the same reference numerals. Specifically, in this embodiment, an RF supply section 30 is connected to an upper electrode 16 (configured as a showerhead) having a number of through holes 16a for delivering a process gas. On the other hand, a lower electrode (susceptor) 14, i.e., an electrode facing the upper electrode 16, is configured to place a target substrate or wafer W thereon.

Further, the present invention may be applied to an apparatus of the type in which both of upper and lower electrodes are respectively supplied with RF powers of different frequencies. Alternatively, the present invention may be applied to a plasma processing apparatus of the helicon wave plasma type or of the ECR plasma type in which an RF electrode is disposed outside the process chamber. Furthermore, the target substrate of the present invention is not limited to a semiconductor wafer, and it may be selected from various substrates for a FPD, photo mask, CD, and printed board.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An RF supply system to be connected to an RF electrode, which is disposed through an insulating member outside or inside a process chamber comprising a conductive part connected to ground potential through a grounding path, to assist a plasma process performed in the process chamber, the system comprising:

an RF power supply configured to supply an RF power for plasma generation to the electrode through a transmission path;

a matching unit disposed on the transmission path between the RF power supply and the RF electrode and connected to the RF power supply through a first portion of the transmission path, the matching unit being configured to match an impedance as viewed from the RF power supply to the RF electrode, with an impedance of the RF power supply side; and an impedance converter disposed adjacent to or integrated with the RF electrode and on the transmission path between the matching unit and the RF electrode and connected to the matching unit through a second portion of the transmission path, the impedance converter comprising a first reactance element provided on the transmission path between the matching unit and the RF electrode in series therewith and a second reactance element connecting the transmission path to the grounding path in parallel with the process chamber, and the impedance converter being configured to set a load impedance on the RF electrode side, as viewed from the matching unit, to an impedance higher than an actual impedance on the RF electrode side, wherein the impedance converter is configured as a matching circuit network to match the actual impedance on the RF electrode side with a characteristic impedance of a transmission line which forms the second portion of the transmission path.

2. The system according to claim 1, wherein the first and second reactance elements include a capacitor and a coil.

3. The system according to claim 2, wherein the capacitor and the coil are a non-variable capacitor and a non-variable inductor, respectively.

4. The system according to claim 1, wherein the matching unit comprises a variable capacitor and an adjusting mechanism configured to adjust capacitance of the variable capacitor.

5. The system according to claim 1, wherein the second portion of the transmission path comprises a coaxial cable configured to transmit the RF power from an output terminal of the matching unit to an input terminal of the impedance converter.

6. The system according to claim 1, wherein the second reactance element comprises a capacitor and a coil.

7. The system according to claim 6, wherein the first reactance element comprises a capacitor and a coil connected in series.

8. A plasma processing apparatus comprising:
a process chamber comprising a conductive part connected to ground potential through a grounding path and configured to provide a pressure-reduced space for performing a plasma process on a target substrate;
an RF electrode disposed through an insulating member outside or inside the process chamber to assist the plasma process;
a process gas supply system configured to supply a process gas into the process chamber;
an RF power supply configured to supply an RF power for plasma generation to the RF electrode through a transmission path;
a matching unit disposed on the transmission path between the RF power supply and the RF electrode and connected to the RF power supply through a first portion of the transmission path, the matching unit being configured to match an impedance, as viewed from the RF power supply to the RF electrode, with an impedance of the RF power supply side; and
an impedance converter disposed adjacently to or integrated with the RF electrode and on the transmission path between the matching unit and the RF electrode and connected to the matching unit through a second portion of the transmission path, the impedance converter comprising a first reactance element provided on the transmission path between the matching unit and the RF electrode in series therewith and a second reactance element connecting the transmission path to the grounding path in parallel with the process chamber, and the impedance converter being configured to set a load impedance on the RF electrode side, as viewed from the matching unit, to an impedance higher than an actual impedance on the RF electrode side,
wherein the impedance converter is configured as a matching circuit network to match the actual impedance on the RF electrode side with a characteristic impedance of a transmission line which forms the second portion of the transmission path.

9. The apparatus according to claim 8, wherein the first and second reactance elements include a capacitor and a coil.

10. The apparatus according to claim 9, wherein the capacitor and the coil are a non-variable capacitor and a non-variable inductor, respectively.

11. The apparatus according to claim 8, wherein the matching unit comprises a variable capacitor and an adjusting mechanism configured to adjust capacitance of the variable capacitor.

12. The apparatus according to claim 8, wherein the second portion of the transmission path comprises a coaxial cable configured to transmit the RF power from an output terminal of the matching unit to an input terminal of the impedance converter.

13. The apparatus according to claim 8, wherein a counter electrode is disposed in parallel with the RF electrode in the process chamber.

14. The apparatus according to claim 13, wherein the target substrate is placed on the RF electrode, and the counter electrode has through holes for delivering the process gas toward the RF electrode.

15. The apparatus according to claim 13, wherein the target substrate is placed on the counter electrode, and the RF electrode has through holes for delivering the process gas toward the counter electrode.

16. The apparatus according to claim 8, wherein the second reactance element comprises a capacitor and a coil.

17. The apparatus according to claim 16, wherein the first reactance element comprises a capacitor and a coil connected in series.

18. The apparatus according to claim 8, wherein the impedance converter includes a conductive casing independent of the matching unit, supported by the process chamber, and connected to ground potential through the process chamber, and the second reactance element connects the transmission path to the casing.

* * * * *